United States Patent
Yeung et al.

(10) Patent No.: US 9,419,748 B2
(45) Date of Patent: *Aug. 16, 2016

(54) ADVANCE CLOCKING SCHEME FOR ECC IN STORAGE

(71) Applicant: SK hynix memory solutions inc., San Jose, CA (US)

(72) Inventors: Kwok W. Yeung, Milpitas, CA (US); Kin Man Ng, Hong Kong (HK); Kin Ming Chan, Milpitas, CA (US)

(73) Assignee: SK Hynix memory solutions Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/454,057

(22) Filed: Aug. 7, 2014

(65) Prior Publication Data

US 2015/0033093 A1  Jan. 29, 2015

Related U.S. Application Data

(63) Continuation of application No. 13/404,372, filed on Feb. 24, 2012, now Pat. No. 8,839,051.

(60) Provisional application No. 61/446,894, filed on Feb. 25, 2011.

(51) Int. Cl.
| | | |
|---|---|---|
| G06F 11/00 | (2006.01) | |
| H04L 1/00 | (2006.01) | |
| G06F 11/10 | (2006.01) | |
| H03M 13/11 | (2006.01) | |
| H03M 13/29 | (2006.01) | |
| H03M 13/37 | (2006.01) | |
| H03M 13/00 | (2006.01) | |
| H03M 13/41 | (2006.01) | |

(52) U.S. Cl.
CPC ........... *H04L 1/004* (2013.01); *G06F 11/10* (2013.01); *H03M 13/1111* (2013.01); *H03M 13/2933* (2013.01); *H03M 13/3715* (2013.01); *H03M 13/3738* (2013.01); *H03M 13/6502* (2013.01); *H03M 13/6508* (2013.01); *H04L 1/005* (2013.01); *H04L 1/0053* (2013.01); *H03M 13/4138* (2013.01)

(58) Field of Classification Search
CPC . G11B 20/18; G11B 20/1816; G06F 11/1076
See application file for complete search history.

(56) References Cited

U.S. PATENT DOCUMENTS

| | | | | |
|---|---|---|---|---|
| 7,639,764 B2* | 12/2009 | Cohen | .......................... | 375/354 |
| 8,839,051 B1* | 9/2014 | Yeung | ..................... | G06F 11/10 |
| | | | | 714/54 |
| 2007/0116147 A1* | 5/2007 | May | ....................... | H04B 15/02 |
| | | | | 375/316 |
| 2007/0116150 A1* | 5/2007 | May | ....................... | H03D 3/007 |
| | | | | 375/322 |
| 2007/0165747 A1* | 7/2007 | May | ....................... | H04B 15/02 |
| | | | | 375/316 |
| 2010/0079316 A1* | 4/2010 | Okuno | .................... | H03M 9/00 |
| | | | | 341/100 |
| 2014/0108875 A1* | 4/2014 | Jin | ......................... | G11B 20/18 |
| | | | | 714/54 |
| 2014/0181570 A1* | 6/2014 | Tedja | ...................... | G06F 1/206 |
| | | | | 713/501 |
| 2015/0161069 A1* | 6/2015 | Dhandapani | ........ | G06F 13/4054 |
| | | | | 710/301 |

* cited by examiner

*Primary Examiner* — Amine Riad
(74) *Attorney, Agent, or Firm* — IP & T Group LLP (57) ABSTRACT

A system for clocking a decoder is disclosed. The system includes: a channel front end configured to receive input data, a first clock configured to provide a first clock signal as input to the channel front end, a decoder configured to receive intermediate data associated with the output of the channel front end, and a second clock configured to provide a second clock signal as input to the decoder. In some embodiments, the second clock signal is not derived from the first clock signal.

19 Claims, 10 Drawing Sheets

ADVANCE CLOCKING SCHEME FOR ECC IN STORAGE

CROSS REFERENCE TO OTHER APPLICATIONS

This application is a continuation of co-pending U.S. patent application Ser. No. 13/404,372, entitled ADVANCE CLOCKING SCHEME FOR ECC IN STORAGE filed Feb. 24, 2012 which is incorporated herein by reference for all purposes, which claims priority to U.S. Provisional Patent Application No. 61/446,894 entitled ADVANCE CLOCKING SCHEME FOR ECC IN STORAGE filed Feb. 25, 2011 which is incorporated herein by reference for all purposes.

BACKGROUND OF THE INVENTION

Storage media device systems typically comprise a channel front end that processes incoming data, such as data being read from a hard disk drive, and a decoder that processes data from the channel front end and provides error correction. The speed at which the decoder can process data can have a significant impact on the performance of the system. For example, when data is read and/or processed by the channel front end faster than the decoder takes to finish processing the data, backups and/or other problems can occur. As such, improved techniques for handling incoming data and error correction would be desirable. In particular, techniques that address the problem of longer decode processing times would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
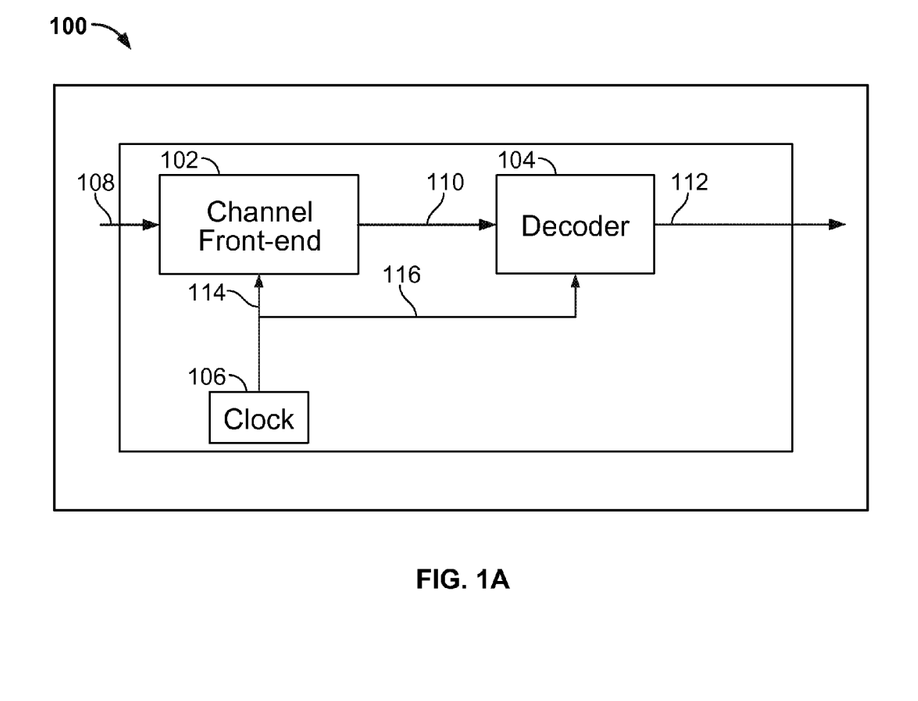
FIG. 1A is a block diagram illustrating an embodiment of a hard disk drive controller.

FIG. 1A is a block diagram illustrating an embodiment of a hard disk drive controller. Hard disk controller (HDC) 100 is shown to include channel front end 102, decoder 104, and clock 106. Clock 106 provides a clock signal 114 to channel front end 102 and a clock signal 116 to decoder 104. Channel front end 102 processes input data 108 and outputs data 110, which in some embodiments, comprises multiple parallel data lines. For example, in a T/4 system, data 110 comprises 4 parallel lines of data. In some embodiments, for cases in which data 110 comprises multiple parallel data lines, clock signal 114 is divided by the number of parallel data lines by a clock divider (not shown) to produce clock signal 116.

In this example, decoder 104 runs off of the same clock 106 that feeds channel front end 102, either directly or through a clock divider. In other words, clock signal 116 is derived from clock signal 114. In some embodiments, clock 106 has the same frequency as the data rate of input signal 108. Therefore, this configuration scales the processing bandwidth of decoder 104 together with the input data rate. For example, if decoder 104 can perform a maximum of N iterations for an incoming data rate of 1 Gbps (i.e., the frequency of clock signal 106 is 1 GHz) in a sector time window, it will also perform the same number of iterations at 0.5 Gbps (i.e., the frequency of clock signal 106 is 0.5 GHz) in a sector time window. However, the time window in the latter case is twice the duration in absolute time. Therefore, this configuration leaves room for improvement, as decoder 104 may be inefficiently utilized.

A sector time window or sector time frame, as used herein, refers to the time it takes to receive and store a sector of data, e.g., process a sector of data through channel front end 102. Although a sector, sector time window, or sector time frame may be described herein, this technique may be extended to other media storage systems besides hard disk drive systems, such as solid-state drive (SSD) systems.

Figure 1B:
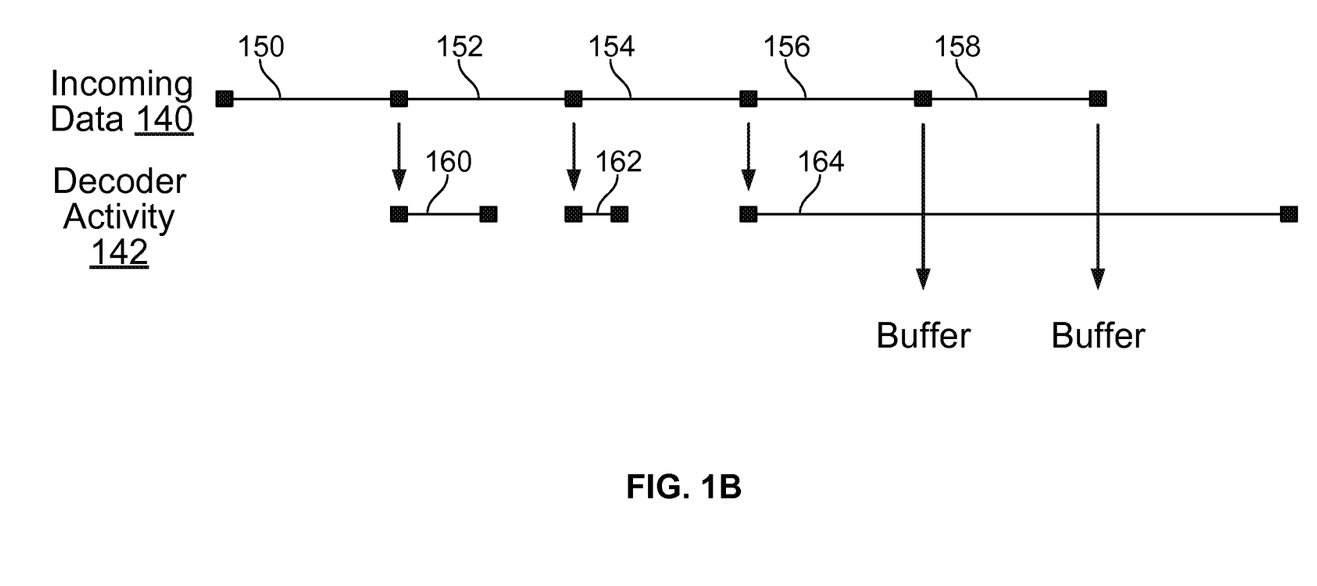
FIG. 1B is a timing diagram illustrating an example of incoming data and decoder activity.

FIG. 1B is a timing diagram illustrating an example of incoming data and decoder activity. In this example, timeline 140 shows incoming sector time frames 150, 152, 154, 156, and 158 coming in consecutively. Each of sector time frames 150, 152, 154, 156, and 158 shows the time it takes each sector to be read. In timeline 142, each of decoder activity processing times 160, 162, and 164 are shown below timeline 140. Processing time 160 is the time it takes to process the sector corresponding to sector time frame 150 through the decoder, processing time 162 is the time it takes to process the sector corresponding to sector time frame 152 through the decoder, and processing time 164 is the time it takes to process the sector corresponding to sector time frame 154 through the decoder. As shown, processing times 160 and 162 are both complete in time for the next sector (164) to be processed. However, processing time 164 takes up more than one sector time frame. Therefore, sectors 156 and 158 both need to be buffered before they can be processed by the decoder. In some cases, this could lead to a significant backlog of buffered data. As such, it would be desirable to speed up processing time through the decoder, e.g., for sectors that have a higher error rate and therefore take a longer time to process through the decoder.

Figure 2:
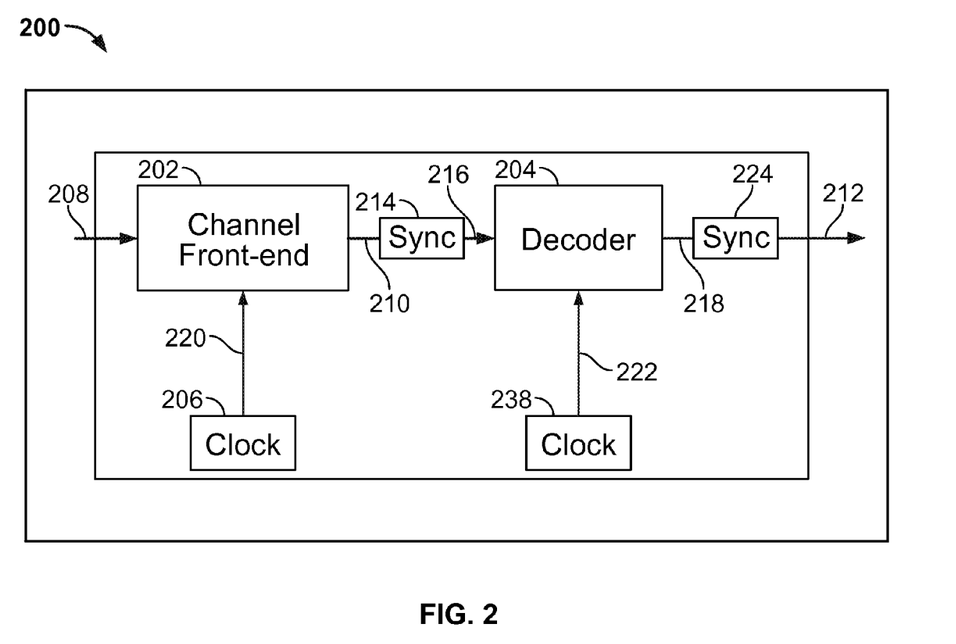
FIG. 2 is a block diagram illustrating an embodiment of data rate independent clocking of a decoder.

FIG. 2 is a block diagram illustrating an embodiment of data rate independent clocking of a decoder. Storage media device controller 200 is shown to include channel front end 202, decoder 204, clock 206, and clock 238. For example, storage media device controller 200 may comprise a hard disk drive controller for controlling a hard disk drive.

In this example, clock 206 provides a clock signal 220 to channel front end 202 and clock 238 provides a clock signal 222 to decoder 204. Clock signal 222 is not derived from clock signal 220. In some embodiments, clock 206 and/or clock signal 220 are independent of clock 238 and/or clock signal 222. In some embodiments, clock 206 has the same frequency as the data rate of input signal 208. Thus, the clocking of decoder 204 is detached from the input data rate of input data 208, so decoder 204 can be clocked at a relatively (compared to input data rate) higher frequency to achieve more iterations within the same time window. In some embodiments, the frequency of clock 238 is always greater than or equal to the frequency of clock signal 206.

Input data 208 is provided as input to channel front end 202. For example, input data 208 may include data read from a hard disk drive. Channel front end 202 processes input data 208 and outputs data 210, which in some embodiments, comprises multiple parallel data lines. For example, in a T/4 system, data 210 comprises 4 parallel lines of data. Data 210 is provided as input to synchronization logic 214, which outputs intermediate data 216. Intermediate data 216 is provided as input to decoder 204. In some embodiments, decoder 204 comprises an error correction code (ECC) decoder and/or SOVA decoder. Output 218 of decoder 204 is provided as input to output synchronization logic 224, which outputs data 212 from storage media device controller 200. In various embodiments, appropriate synchronization logic is included. Synchronization logic 214 and/or output synchronization logic 224 are optional. In some embodiments, synchronization logic 214 is configured to synchronize the output of the channel front end with the second clock signal 222. In some embodiments, output synchronization logic 224 is configured to synchronize the output of the decoder with the first clock signal 206. In various embodiments, synchronization logic 214 and/or output synchronization logic 224 comprises a buffer (e.g., FIFO) or other storage element, e.g., to store data from a previous cycle.

In some embodiments, channel data or front end clock 206 is independent of decoder clock 238. Decoder 204 can be clocked (by clock 208) at a preset frequency. In some embodiments, the preset frequency can range from the frequency of clock 206 up to the highest frequency it is allowed to run in order to close timing (e.g., meet timing closure requirements) even when the incoming data rate is low. In some embodiments, the preset frequency is lower in order to limit the peak power consumption. For example, the preset frequency may be lower than the highest frequency allowed in order to close timing.

In some other embodiments, clock 206 is optional. For example, clock 238 may be a faster clock (e.g., with a higher frequency than the incoming data rate) that may be divided down via a clock divider to provide clock signal 220 at a speed that matches the incoming data rate. In this case, clock signal 220 is derived from clock 238 via the clock divider.

Storage media devices, such as hard disk drives, can vary in quality depending on process variation during manufacturing. A slow process corner refers to a lower quality media device, which may limit the speed at which clock 238 can run, e.g., in order to close timing. For media that are not from the slow process corner, the decoder clock 238 can be run at an even higher frequency to achieve an even higher iteration count for each sector time frame. This can further increase the correcting capability and the performance of the decoder. From this additional performance, the yield of the data storage media can be increased and cost saving benefit can be achieved.

In some embodiments, each storage media device can be individually tuned based on process quality. Hard disk controllers configured to control lower quality hard disk media may have decoder clocks configured to run at a higher speed because lower quality hard disk media will contain more error and thus lower SNR, which requires more iterations to fix such errors. In some embodiments, an on-chip process monitor can regularly measure PVT (process, voltage, and temperature), where the process measurement gives some indication of process quality. If, over time, the process measurement changes, the decoder clock speed can automatically be adjusted accordingly (e.g., lower speed if the process quality decreases), e.g., using a clock controller, as more fully described below.

This clocking scheme is particularly useful for iterative type ECC decoding, in which there is no predetermined time during which the decoding will be completed. One example of iterative type ECC decoding is LDPC decoding, in which performance depends on how many iterations can be performed for a given sector without running out of hardware resources (e.g. due to buffer size or hardware processing bandwidth limitations).

The following table is an example comparing system 100 and system 200, assuming the decoder is timing closed at 1 GHz and is a 4 T division of the highest data rate.

| Input Data Rate | System 100 | System 200 | Benefit |
|---|---|---|---|
| 4G | 1 GHz (4 T) | 1 GHz | same |
| 2G | 500 MHz (4 T) | 1 GHz | 2× processing power* |
| 1G | 250 MHz (4 T) | 1 GHz | 4× processing power |

*2× processing power refer to 2× iterations within the same time window.

In some embodiments, the storage media device does not meet a specification requirement if the channel front end and decoder both use the same clock, such as in controller 100, but does meet the specification requirement when the channel front end and decoder use different clocks or when the clock (signal) used by the decoder is not derived from the clock (signal) used by the channel front end, such as in controller 200. For example, the specification requirement may include one or more of: number of uncorrectable errors, a gate count, and an area of hardware in which to design (e.g., a hardware size limitation).

Figure 3:
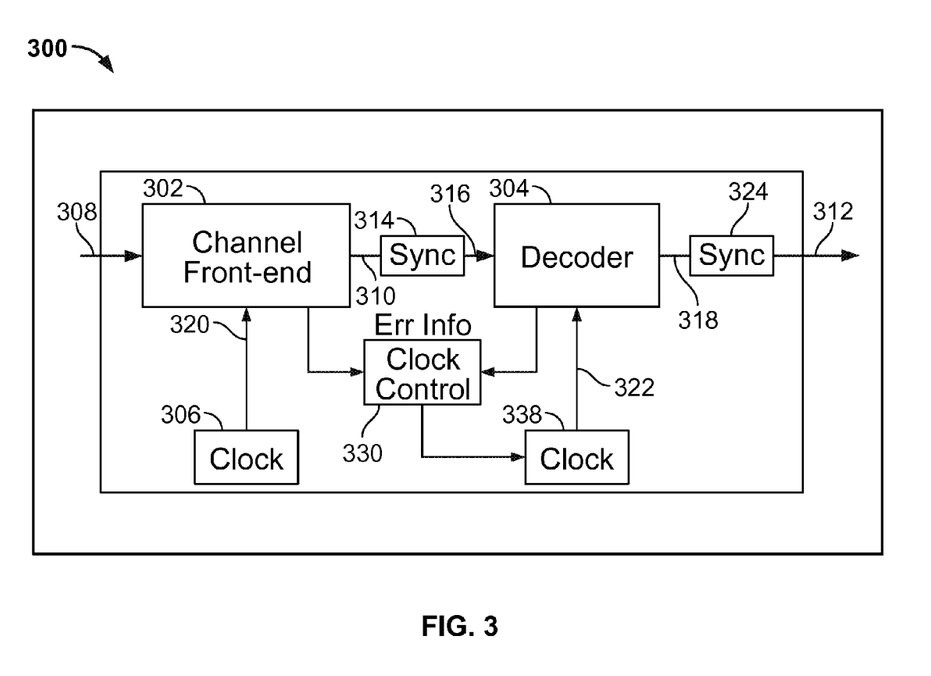
FIG. 3 is a block diagram illustrating an embodiment of dynamic clocking of a decoder.

FIG. 3 is a block diagram illustrating an embodiment of dynamic clocking of a decoder. Storage media device controller 300 is shown to include channel front end 302, decoder 304, clock 306, clock 338, and clock controller 330. For example, storage media device controller 300 may comprise a hard disk drive controller for controlling a hard disk drive.

In this example, clock 306 provides a clock signal 320 to channel front end 302 and clock 338 provides a clock signal 322 to decoder 304. In some embodiments, clock 306 and/or clock signal 320 are independent of clock 338 and/or clock signal 322. Clock 306 has the same frequency as the data rate of input signal 308. Thus, the clocking of decoder 304 is detached from the input data rate of input data 308, so decoder 304 can be clocked at a relatively (compared to input data rate) higher frequency to achieve more iterations within the same time window. In some embodiments, the frequency of clock 338 is always greater than or equal to the frequency of clock signal 306.

Input data 308 is provided as input to channel front end 302. For example, input data 308 may include data read from a hard disk drive. Channel front end 302 processes input data 308 and outputs data 310, which in some embodiments, comprises multiple parallel data lines. For example, in a T/4 system, data 310 comprises 4 parallel lines of data. Data 310 is provided as input to synchronization logic 314, which outputs intermediate data 316. Intermediate data 316 is provided as input to decoder 304. In some embodiments, decoder 304 comprises an error correction code (ECC) decoder and/or SOVA decoder. Output 318 of decoder 304 is provided as input to output synchronization logic 324, which outputs data 312 from storage media device controller 300. In various embodiments, appropriate synchronization logic is included. Synchronization logic 314 and/or output synchronization logic 324 are optional. In some embodiments, synchronization logic 314 is configured to synchronize the output of the channel front end with the second clock signal 322. In some embodiments, output synchronization logic is configured to synchronize the output of the decoder with the first clock signal 320. In various embodiments, synchronization logic 314 and/or output synchronization logic 324 comprises a buffer (e.g., FIFO) or other storage element.

In some embodiments, channel data or front end clock 306 is independent of decoder clock 338. Decoder 304 can be clocked by clock 338 at a dynamic frequency up within a preset range. For example, the range may be from the frequency of clock 306 up to the highest frequency it is allowed to run in order to close timing (e.g., meet timing closure requirements) even when the incoming data rate is low. In some embodiments, a ceiling limits the maximum allowable frequency of clock 338 in order to limit the peak power consumption. For example, the maximum allowable frequency in order to limit peak power may be lower than the highest frequency allowed in order to close timing.

In some embodiments, clock controller 330 is used to dynamically adjust or scale the frequency of clock 338 based at least in part on error information associated with input data 308. For example, clock 338 is tuned up when the incoming data has more errors (e.g., a higher error rate) and requires more iterations by decoder 304. When the error rate is low, clock 338 is tuned down to save power. Error information (e.g., error rate, number of errors, etc.) associated with incoming data can be collected from one or more stages along the data path of the controller 300. In system 300, clock controller 330 is shown to collect or obtain error information from channel front end 302 and decoder 304. For example, clock controller 330 can be configured to regularly monitor the number of errors or error rate information.

Figure 4:
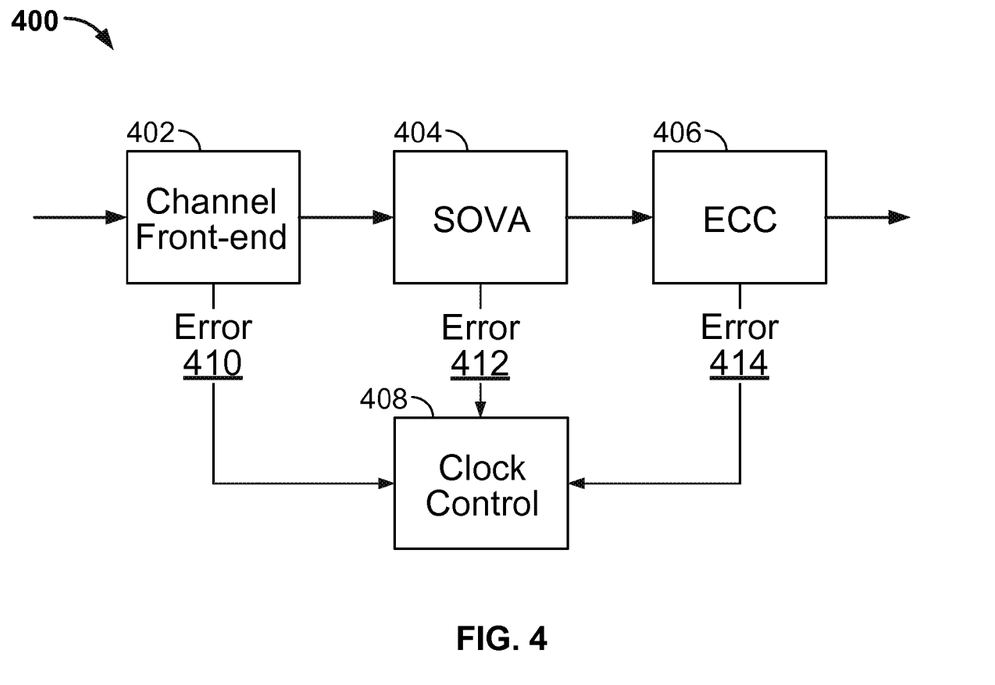
FIG. 4 is a diagram illustrating an example of various stages along the data path of a controller from which error information may be collected.

FIG. 4 is a diagram illustrating an example of various stages along the data path of a controller from which error information may be collected. Data path 400 is shown to include channel front end 402, SOVA decoder 404, and ECC decoder 406. In this example, as shown, error information 410, 412, and/or 414 can be collected or otherwise obtained from one or more of channel front end 402, SOVA decoder 404, and ECC decoder 406. For example, statistics such as FIR BER may be collected from channel front end 402. SOVA bit error may be collected from SOVA decoder 404. ECC decoder bit or symbol error count may be collected from ECC decoder 406. The error information is provided as input to clock controller 408, which uses the error information to adjust or scale the clock frequency of the input to the decoder. In this example, the decoder includes SOVA decoder 404 and ECC decoder 406.

In some embodiments, when the error rate increases, the clock frequency of the decoder is increased. Because the error rate is measured using a data frame already processed through the decoder, the already processed data frame may not benefit from the increased clock frequency of the decoder. However, future data frames processed from the point of increased clock frequency forward can benefit from the increased clock frequency. Therefore, this technique is particularly useful for cases in which there are consecutive data frames of error, such as if the read head is off-track in the case of a hard disk drive. In some other embodiments, the error information for a data frame can be obtained in time to adjust the clock frequency for processing the same data frame.

Figure 5:
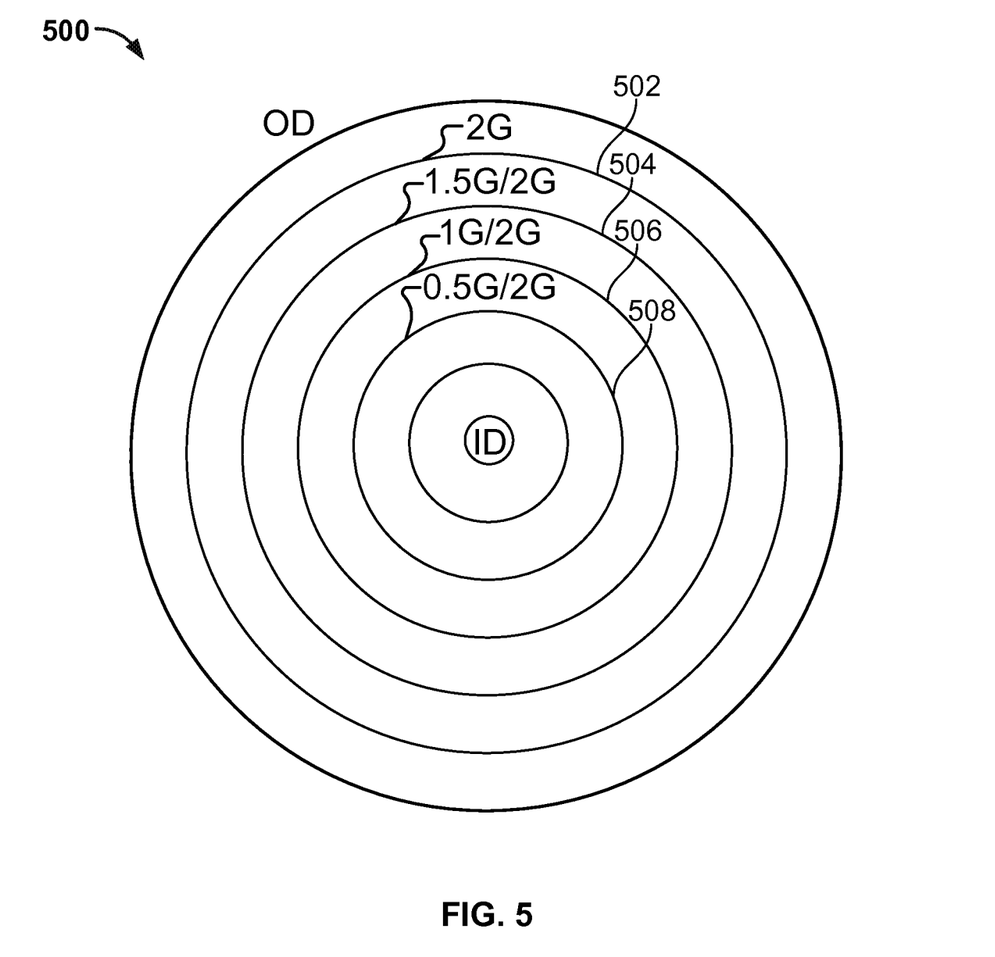
FIG. 5 is a diagram illustrating an example of various data zones on a hard disk drive.

FIG. 5 is a diagram illustrating an example of various data zones on a hard disk drive. In this example, tracks 502-508 at various locations on hard disk drive 500 are shown. Moving towards the outer diameter (OD), the input data rate increases. Moving towards the inner diameter (ID), the input data rate decreases. Thus, the frequency of the clock input to the front end increases when reading from a data zone closer to the OD, and decreases when reading from a data zone closer to the ID. In some embodiments, the frequency of the clock input to the decoder is independent of read location on the hard disk drive and independent of the input data rate. For example, the frequency of the clock input to the decoder may remain constant at 2 GHz. In the example shown, at the OD, at track 502, both the channel front end clock and the decoder clock run at 2 GHz. At track 504, the channel front end clock runs at 1.5 GHz and the decoder clock runs at 2 GHz. At track 506, the channel front end clock runs at 1 GHz and the decoder clock runs at 2 GHz. At track 508, the channel front end clock runs at 0.5 GHz and the decoder clock runs at 2 GHz. In some embodiments, more important data is stored at the inner diameter since the ability to decode is very good at the inner diameter with the combination of lower input data rate and high decoder clock rate. In some embodiments, the frequency of the clock input to the decoder is not necessarily constant (e.g., at 2 GHz in this example), but is dynamic, as discussed below.

Figure 6:
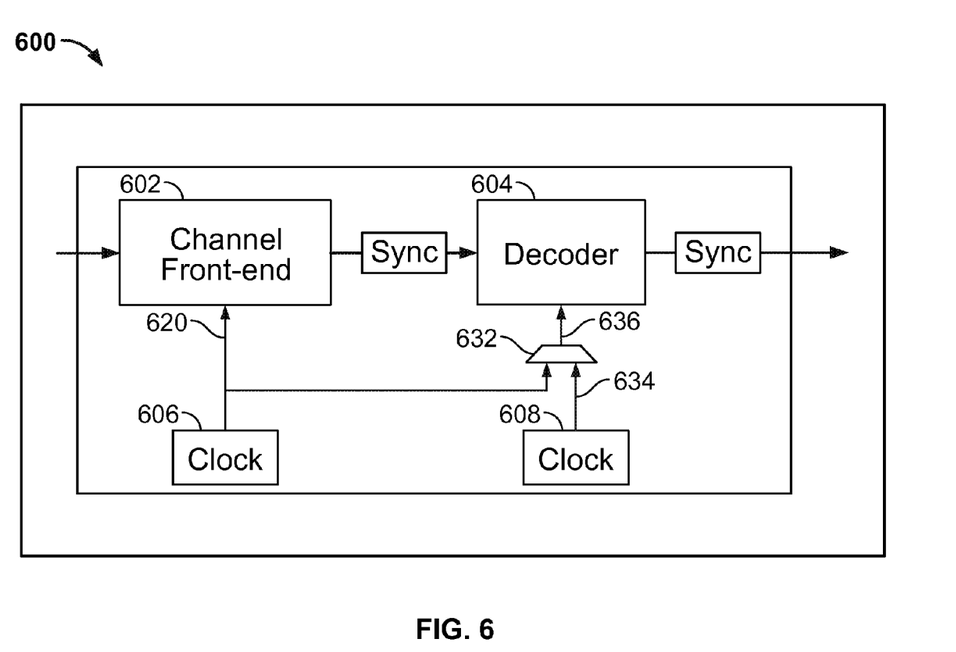
FIG. 6 is a block diagram illustrating an embodiment of data rate independent clocking of a decoder with a selectable clock source option.

FIG. 6 is a block diagram illustrating an embodiment of data rate independent clocking of a decoder with a selectable clock source option. Storage media device controller 600 is shown to include channel front end 602, decoder 604, clock 606, clock 608 and multiplexer (mux) 632. In this embodiment, mux 632 is used to allow a selectable clock source for decoder 604. Mux 632 has clock signal 620 and clock signal 634 as inputs from which the output 636 of mux 632 may be selected. This embodiment may be useful if there is a need for switching to a configuration in which both the channel front end and decoder run off the same clock.

Figure 7:
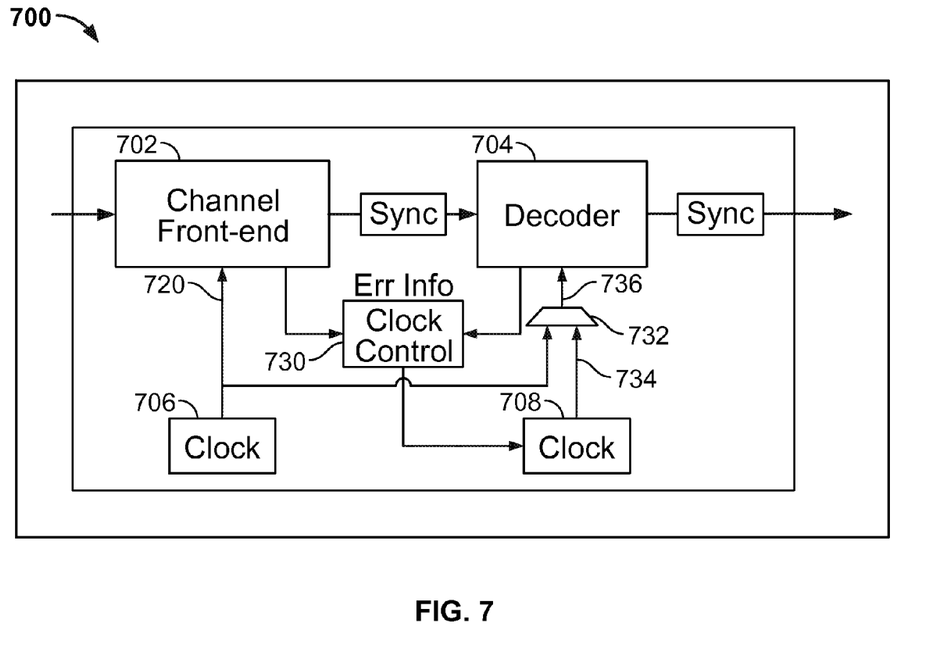
FIG. 7 is a block diagram illustrating an embodiment of dynamic clocking of a decoder with a selectable clock source option.

FIG. 7 is a block diagram illustrating an embodiment of dynamic clocking of a decoder with a selectable clock source option. Storage media device controller 700 is shown to include channel front end 702, decoder 704, clock 706, clock 708, and clock controller 730. In this embodiment, mux 732 is used to allow a selectable clock source for decoder 704. Mux 732 has clock signal 720 and clock signal 734 as inputs from which the output 736 of mux 732 may be selected. This embodiment may be useful if there is a need for switching to a configuration in which both the channel front end and decoder run off the same clock.

Figure 8:
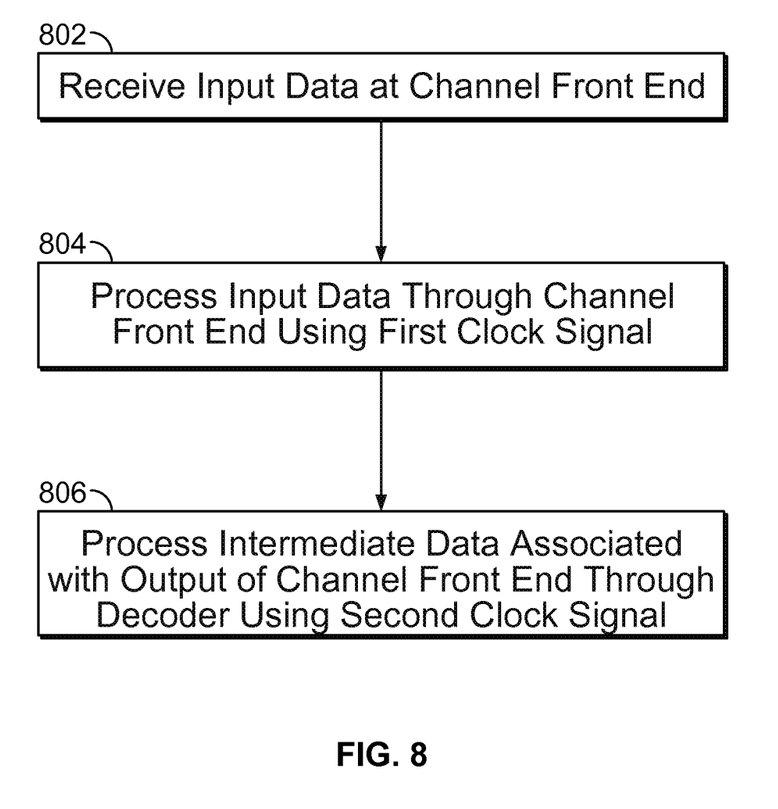
FIG. 8 is a flowchart illustrating an embodiment of a process for clocking a decoder.

FIG. 8 is a flowchart illustrating an embodiment of a process for clocking a decoder. In some embodiments this process may be performed by system 200 or system 300.

At 802, input data is received at a channel front end. For example, in system 200, input data 208 is received at channel front end 202. In system 300, input data 308 is received at channel front end 302.

At 804, the input data is processed through the channel front end using a first clock signal from a first clock. For example, in system 200, input data 208 is processed through channel front end 202 using clock 206. In system 300, input data 308 is processed through channel front end 302 using clock 306.

At 806, intermediate data associated with the output of the channel front end is processed through a decoder, wherein processing is performed using a second clock signal from a second clock having a different frequency from the frequency of the first clock signal. For example, in system 200, intermediate data 216 is processed through decoder 204 using clock signal 222 from clock 238. In system 300, intermediate data 316 is processed through decoder 304 using clock signal 322 from clock 338.

In some embodiments, the speed of the second clock adjusts or scales based at least in part on error information associated with the input data. For example, in system 300, clock controller 330 determines by how much to scale clock 338 based at least in part on error information collected from channel front end 302 and/or decoder 304.

Figure 9:
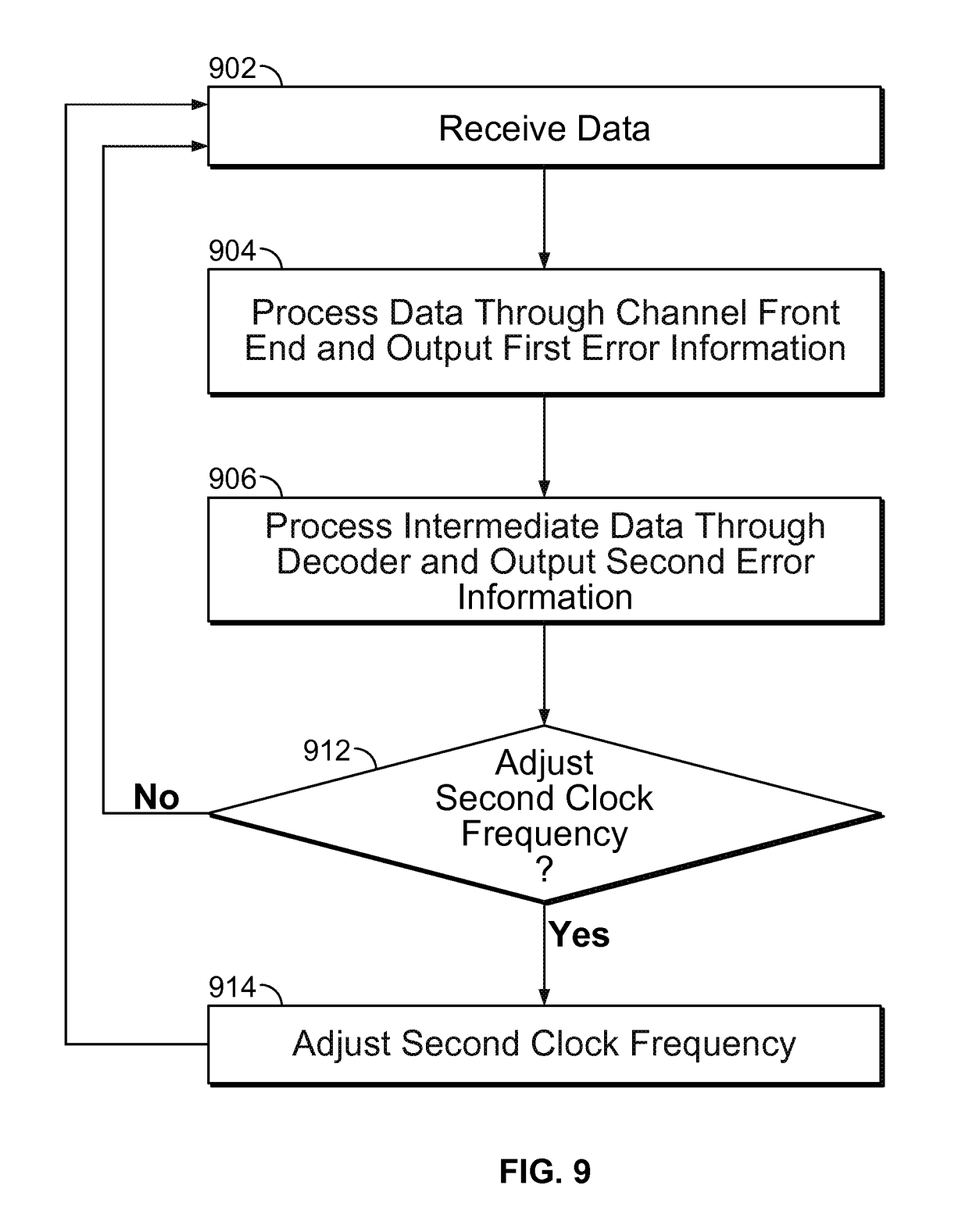
FIG. 9 is a flow chart illustrating an embodiment of adjusting a clock based at least in part on error information.

FIG. 9 is a flow chart illustrating an embodiment of adjusting a clock based at least in part on error information. Initially, the decoder clock rate may be set to some initial or nominal clock rate.

At 902, input data is received. For example, a data frame or sector data frame is received.

At 904, the input data is processed through the channel front end and first error information is output.

At 906, intermediate data is processed through the decoder and second error information is output. In some embodiments, the intermediate data is output from the channel front end. In some embodiments the intermediate data is output from synchronization logic that is indirectly or directly coupled to the output of the channel front end.

At 912, it is determined whether to adjust the decoder clock. In some embodiments, the determination is made based at least in part on the first error information and/or second error information. For example, an error rate is computed using the first and/or second error information and it is determined whether the error rate is too high or too low. For example, an upper or lower threshold may need to be crossed. In some embodiments, only first or second error information is used to make the determination, so only first or second error information is output at 904 or 906 and/or only first or second error information is collected, e.g., by the clock controller.

If it is determined to adjust the decoder clock, at 914, the decoder clock is adjusted. For example, if the computed error rate is too high or too low, the decoder clock rate or frequency is increased or decreased, respectively. In some embodiments, the clock rate or frequency is increased (or decreased) by a predetermined step size. In some embodiments, the clock rate or frequency is scaled proportionally to a number of errors or the error rate. In some embodiments, there is a maximum (or minimum) allowable clock rate or frequency beyond which the clock rate or frequency is not increased (or decreased). The process then returns to 902 and repeats so that the clock can continue to be adjusted as needed, e.g., due to the too high or too low number of errors or error rate, until the number of errors or error rate is within a desired range.

Returning to 912, if it is determined to not adjust the decoder clock, the process returns to 902 so that the process repeats and continues to monitor for error information. In some embodiments, the process does not repeat for every data frame. For example, the process may repeat for every N data frames to save power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for clocking a decoder, comprising:
   a channel front end configured to receive input data and transform the received input data to an output of the channel front end;
   a first clock configured to provide a first clock signal as input to the channel front end;
   a decoder configured to receive intermediate data associated with the output of the channel front end; and
   a second clock configured to provide a second clock signal as input to the decoder, wherein the second clock signal is not derived from the first clock signal,
   wherein the frequency of the second clock is determined based at least in part on storage media device quality.

2. The system of claim 1, wherein the first clock frequency is independent of the second clock frequency.

3. The system of claim 1, wherein the first clock frequency is less than or equal to the second clock frequency.

4. The system of claim 1, further including synchronization logic coupled between the output of the channel front end and the input to the decoder.

5. The system of claim 4, wherein the output of the synchronization logic comprises the intermediate data.

6. The system of claim 4, wherein the synchronization logic comprises a buffer.

7. The system of claim 4, wherein the synchronization logic is configured to synchronize the output of the channel front end with the second clock signal.

8. The system of claim 1, further including a multiplexer coupled to the input clock of the decoder and configured to select between the first clock signal and the second clock signal.

9. The system of claim 1, further including output synchronization logic coupled to the output of the decoder.

10. The system of claim 9, wherein the output synchronization logic is configured to synchronize the output of the decoder with the first clock signal.

11. The system of claim 1, wherein the frequency of the second clock is configured to be at or below a maximum allowable frequency determined based at least in part on timing closure.

12. The system of claim 1, further including a storage media device, wherein the second clock frequency is higher when the storage media device has more errors than when the storage media device has fewer errors.

13. The system of claim 1, wherein the frequency of the second clock is independent of the location on a storage media device from which data is being read.

14. The system of claim 13, wherein the frequency of the second clock is a constant frequency regardless of the location on a storage media device from which data is being read.

15. The system of claim 13, wherein more important data is stored closer to an inner diameter and less important data is stored closer to an outer diameter.

16. A system for clocking, comprising:
- a channel front end configured to receive input data and transform the received input data to an output of the channel front end;
- a first clock configured to provide a first clock signal as input to the channel front end;
- a decoder configured to receive intermediate data associated with the output of the channel front end; and
- a second clock configured to provide a second clock signal as input to the decoder, wherein the second clock signal is not derived from the first clock signal,
- wherein the storage media device does not meet a specification requirement if the decoder uses the first clock, but does meet the specification requirement when the decoder uses the second clock.

17. The system of claim 16, wherein the specification requirement includes one or more of: number of uncorrectable errors, a gate count, and an area of hardware in which to design.

18. A system for clocking, comprising:
- a channel front end configured to receive input data and transform the received input data to an output of the channel front end;
- a first clock configured to provide a first clock signal as input to the channel front end;
- a decoder configured to receive intermediate data associated with the output of the channel front end; and
- a second clock configured to provide a second clock signal as input to the decoder, wherein the second clock signal is not derived from the first clock signal,
- wherein the first clock signal is derived from the second clock signal via a clock divider.

19. A method of clocking a decoder, comprising:
- receiving input data at a channel front end;
- transforming the received input data to an output of the channel front end;
- processing the input data through the channel front end using a first clock signal from a first clock; and
- processing, through a decoder, intermediate data associated with the output of the channel front end, wherein processing is performed using a second clock signal from a second clock, wherein the second clock signal is not derived from the first clock signal,
- wherein the frequency of the second clock is determined based at least in part on storage media device quality.

* * * * *